United States Patent [19]

Sosic et al.

[11] Patent Number: 5,291,612
[45] Date of Patent: Mar. 1, 1994

[54] SYSTEM FOR EVALUATING BOOLEAN EXPRESSIONS USING TOTAL DIFFERENTIAL GENERATING TREE STRUCTURED PROCESSING ELEMENTS CONTROLLED BY PARTIAL SUBFUNCTION DIFFERENTIALS

[75] Inventors: Rok Sosic, Salt Lake City, Utah; Jun Gu, Calgary, Canada

[73] Assignee: University Technologies International, Calgary, Canada

[21] Appl. No.: 653,183

[22] Filed: Feb. 11, 1991

[51] Int. Cl.$^5$ ............................................. G06F 15/20
[52] U.S. Cl. .................... 395/800; 364/259.0; 364/229.41; 364/947.0; 364/DIG. 1; 364/716; 395/500
[58] Field of Search ................. 364/716; 395/800, 500

[56] References Cited

U.S. PATENT DOCUMENTS

| | | | |
|---|---|---|---|
| 3,934,231 | 1/1976 | Armstrong | 364/200 |
| 4,120,043 | 10/1978 | Su | 364/900 |
| 4,306,286 | 12/1981 | Cocke et al. | 364/200 |
| 4,541,067 | 9/1985 | Whitaker | 364/716 |
| 4,551,815 | 11/1985 | Moore et al. | 364/716 |
| 4,792,909 | 12/1988 | Serlet | 364/491 |
| 5,148,513 | 9/1992 | Koza et al. | 395/13 |

Primary Examiner—Parshotam S. Lall
Assistant Examiner—Ken S. Kim
Attorney, Agent, or Firm—Daniel L. Dawes

[57] ABSTRACT

Arbitrary and complex Boolean functions can be evaluated at high speed and with a minimal amount of memory by evaluating the total derivatives of the subfunctions out of which any given Boolean function is built. The Boolean function is then generated from its total derivative. The total derivative of any binary or two input Boolean function is defined by a method dependent only on the inputs and the partial derivatives of the subfunction. By combining the subfunctions in a binary tree, a Boolean function of any complexity can be built up. By using a binary tree structure in a processing circuit or memory organization, the method is generalized to accommodate all possible Boolean functions. A processing element may be devised to generate the total derivative of each subfunction in a tree circuit of such processing elements, or arrays may be defined in a general purpose computer and elements in the array generated according to a processing methodology which assumes a tree relationship between elements in the array.

26 Claims, 7 Drawing Sheets

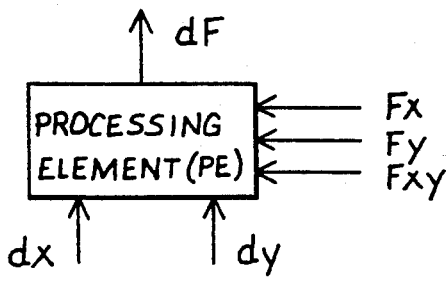
Fig.4
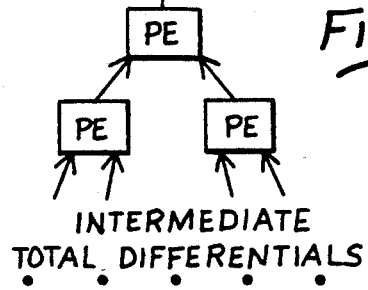
Fig.5
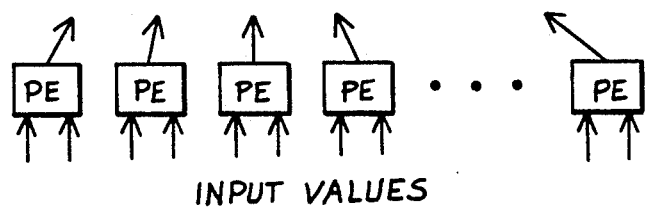
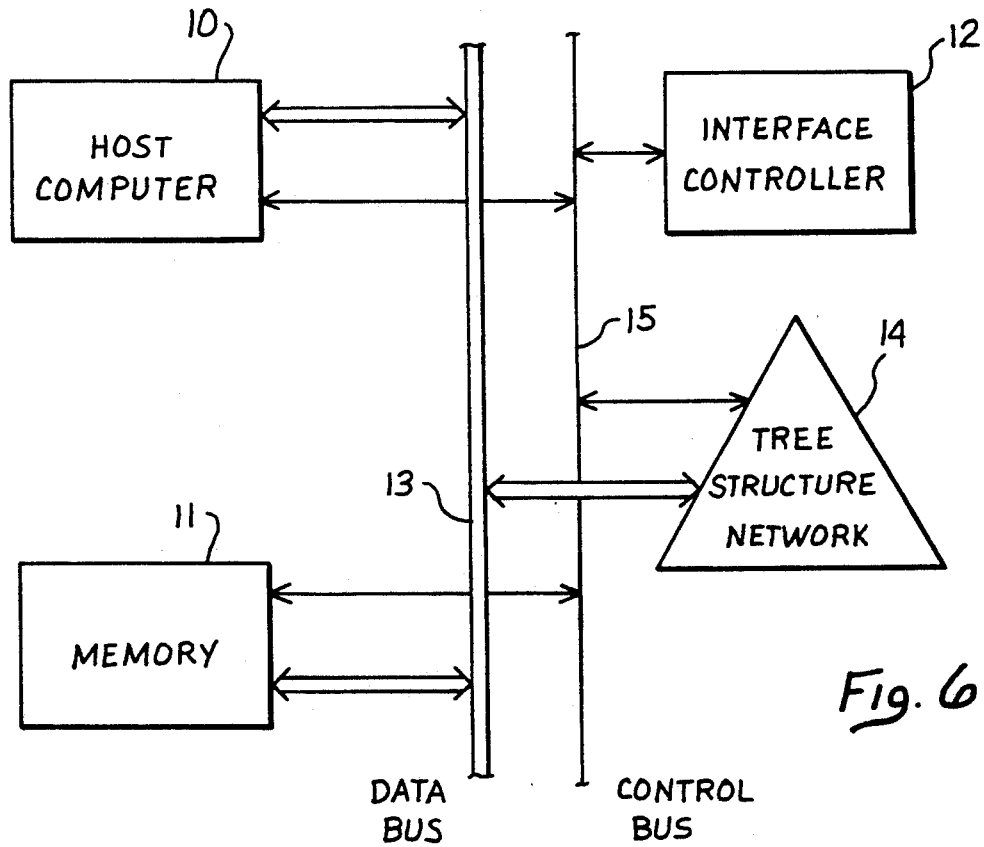
Fig.6

SYSTEM FOR EVALUATING BOOLEAN EXPRESSIONS USING TOTAL DIFFERENTIAL GENERATING TREE STRUCTURED PROCESSING ELEMENTS CONTROLLED BY PARTIAL SUBFUNCTION DIFFERENTIALS

BACKGROUND OF THE INVENTION

1. Field of the Invention

The invention relates to field of logic machines and methods for processing information within logic machines. In particular, the invention relates to electrical circuits and methods of using electrical circuits to evaluate logical relationships.

2. Description of the Prior Art

Efficient processing of Boolean expressions or complex logical signals has many applications in monitoring and debugging digital processes and hardware computing systems. Some other applications of Boolean evaluation are special purpose database search processors and hardware simulators for discrete systems.

The high-level monitoring activity involves the evaluation of Boolean functions based on the real-time behavior of the system being observed. Depending on the purpose of monitoring, different Boolean expressions are evaluated at different time intervals. The problem is how to develop an approach to evaluate an arbitrary Boolean expression in real-time. Some solutions to this monitoring problem include using a fixed set of Boolean expressions (fixed hardware tools), the manual rewiring of the monitor circuit (wired program tools), and the use of a high speed programmable monitor circuit (stored program tools). Stored program tools are the most flexible and satisfactory, but they impose a high cost on the monitor circuit because it must operate at a much faster rate than that of the system being observed.

One possibility of implementing a dynamically reconfigurable circuit that is able to evaluate any Boolean function of two variables is to use three, 2-input multiplexers. A 2-input multiplexer, is symbolically modeled by a Boolean function, $M(a,b,s)$, which has two data inputs a and b, and one control signal s. It evaluates the function:

$$M(a,b,s) = a\bar{s} + bs.$$

Depending on the value of control signal s, input variable a or input variable b is chosen as the output of M. The function, $M(a,b,s)$ can then be used to model an arbitrary logic circuit. For example, let $F(x,y)$ be a Boolean function of two variables. Its value can be defined by:

$$F(0,0) = f_0,$$

$$F(0,1) = f_1,$$

$$F(1,0) = f_2,$$

$$F(1,1) = f_3.$$

It can be shown then that a function, $F(x,y)$, is described by a Boolean expression:

$$F(x,y) = \bar{x}\bar{y}f_0 + \bar{x}yf_1 + x\bar{y}f_2 + xyf_3 \quad (1)$$

Function $F(x,y)$ in Equation (1) can be implemented by three, 2-input multiplexers as follows:

$$F(x,y) = M(M(f_0, f_2, x), M(f_1, f_3, x), y).$$

There are sixteen possible Boolean functions of the two variables which are listed in Table 1 below. In traditional Boolean function processing methods, all sixteen cases are represented by four bits of $F(x,y)$, i.e., f0, f1, f2 and f3. Processing in a tree structure therefore becomes complex when implemented in custom hardware and very time and resource consumptive when implemented in a general purpose computer. In complex Boolean functions the processing time can seriously lag real time needs for the processed result unless the computing circuit is very large and very fast.

What is needed is an apparatus and methodology which will allow any kind of complex Boolean expression to be processed in a real time basis in small computer systems.

BRIEF SUMMARY OF THE INVENTION

The invention is an apparatus for processing a complex Boolean function comprised of a plurality of Boolean subfunctions. The apparatus comprises a host computer for generating a plurality of partial derivatives corresponding to each of the plurality of subfunctions. A tree structure circuit receives a plurality of signals corresponding to independent inputs and generates total differentials of each of the subfunctions and ultimately of the complex Boolean function. The host computer receives the total differential of the complex Boolean function and generates a signal corresponding to the value of the complex Boolean function corresponding to the plurality of inputs coupled to the tree structure circuit. A controller circuit couples the host computer to the tree structure circuit for communicating at least the plurality of partial derivatives from the host computer to the tree structure circuit. As a result, the complex Boolean function is evaluated at high speed and minimal use of memory.

In one embodiment the tree structure circuit comprises a plurality of identical processing circuit organized and coupled with one another in a tree structure. The tree structure is a full binary tree structure. Each of the processing circuit has only two inputs.

The processing circuit is a logic circuit having inputs x and y. The host computer generates signals corresponding to the partial derivatives, $F_x$, $F_y$, and $F_{xy}$ of the subfunction corresponding to the processing circuit. The signals corresponding to the partial derivatives $F_x$, $F_y$ and $F_{xy}$ are coupled to the processing circuit and logically combined therein to generate a total differential of the subfunction corresponding to the processing circuit.

The processing circuit combines the inputs x and y with the signals corresponding to the partial derivatives $F_x$, $F_y$ and $F_{xy}$ as modeled by the equation:

$$dF = F_x dx \oplus F_y dy \oplus F_{xy} dx\, dy,$$

where F is the subfunction corresponding to the processing circuit.

In another embodiment the processing circuit combines the inputs x and y with the signals corresponding to the partial derivatives $F_x$, $F_y$ and $F_{xy}$ as modeled by the equation:

$$dF = F_x dx\, \overline{dy} + F_y \overline{dx}\, dy + (F_x \oplus F_y \oplus F_{xy}) dx\, dy,$$

where F is the subfunction corresponding to the processing circuit.

In still another embodiment the processing circuit combines the inputs x and y with the signals corresponding to the partial derivatives $F_x$, $F_y$ and $F_{xy}$ as modeled by the equation:

$$dF = \overline{dx + \overline{dy} + \overline{F_y}} + \overline{\overline{dx} + dy + \overline{F_x}} + \overline{\overline{dx} + \overline{dy}} +$$
$$\overline{F_x} \oplus \overline{F_y} \oplus \overline{F_{xy}},$$

where F is the subfunction corresponding to the processing circuit.

In one embodiment the processing circuit comprises a plurality of switch circuits having an input for receiving a signal corresponding to the partial derivatives of the corresponding subfunction the complex Boolean function. Two control gates are controlled by one of the differentials dx and dy of the inputs x and y. The plurality of switches are combined to generate a total derivative of the subfunction. The plurality of switches are combined to model the equation:

$$dF = S(S(F_y, \overline{dx})) + S(F_x \oplus F_y \oplus F_{xy}, dx\cdot ), dy) + S(S(F_x, dx), \overline{dy})$$

where S (a, c) = a*c.

In still another embodiment the processing circuit comprises three 3-input NOR gates and two inverters combined to logically operate as modeled by equation:

$$dF = \overline{dx + \overline{dy} + \overline{F_y}} + \overline{\overline{dx} + dy + \overline{F_x}} + \overline{\overline{dx} + \overline{dy}} +$$
$$\overline{F_x} \oplus \overline{F_y} \oplus \overline{F_{xy}}.$$

The invention can also be characterized as an apparatus for processing an arbitrary, complex Boolean function comprised of a plurality of subfunctions. The apparatus comprises a circuit for receiving a plurality of inputs, and a circuit for generating a plurality partial derivatives of each of the subfunctions. A circuit generates a plurality total derivatives according to a predetermined rule. A circuit combines the plurality of total derivatives, partial derivatives and inputs in a tree structured organization to generate a total derivative of the Boolean function. A circuit generates that value of the Boolean function for the corresponding plurality of inputs. As a result, the complex Boolean function is evaluated at high speed and minimal use of memory.

The circuit for generating a plurality partial derivatives of each of the subfunctions comprises a memory and a processor circuit for retrieving the partial derivatives stored in the memory corresponding to each the subfunction and for storing the retrieved partial derivatives in an array fp and fxy in the memory.

The circuit for generating a plurality total derivatives according to a predetermined rule comprises the memory and the processor circuit. The processor circuit generates a total derivative of each the subfunction and for storing the generated total derivative of each the subfunction in an array df in the memory.

The circuit for combining the plurality of total derivatives, partial derivatives and inputs comprises the memory and processor circuit and combines the plurality of total derivatives, partial derivatives and inputs in a binary tree of the arrays df, fp and fxy organized in the memory to generate the total derivative of the Boolean function.

The array fp and fxy are two separate arrays in the memory. The array fp stores partial derivatives $F_x$ and $F_y$. Array dfxy stores partial derivatives $F_{xy}$ for each the subfunction.

The circuit for generating that value of the Boolean function for the corresponding plurality of inputs comprises a memory and a processor circuit which generates the Boolean function F in the memory and processor circuit as modeled by the equation:

$$F(\vec{v}) = F(0) \oplus dF(\vec{v})$$

where $\vec{v}$ is a data vector having as its elements the plurality of inputs.

The circuit for generating a plurality total derivatives according to a predetermined rule comprises a memory and processor circuit and generates the total derivatives for each subfunction by circuit modeled by equation:

$$dF = (\overline{dx} * F_x) \oplus (dy * (F_y \oplus (dx * F_{xy}))).$$

The circuit for combining the plurality of total derivatives, partial derivatives and inputs in a tree structured organization to generate a total derivative of the Boolean function comprises a memory and a processor circuit wherein the tree structured organization is a full binary tree.

The memory and full binary tree is organized in the memory from an array df, an array fp, and an array fxy. Array df stores total derivatives of each of the subfunctions corresponding to each node in the tree. Array fp stores partial derivatives $F_x$ and $F_y$ corresponding to each node in the tree. Array fxy stores partial derivatives $F_{xy}$ corresponding to each node in the tree.

The invention is also a method of processing a Boolean function comprised of a plurality of Boolean subfunctions in a memory and processing circuit comprising the step of initializing the memory and processing circuit by evaluating in the processing circuit the Boolean function for all independent variables set to 0 to define an initialized value of the Boolean function. The step of initializing includes the step of determining in the processing circuit partial derivatives for each the subfunction of the Boolean function. The initialized value of the Boolean function and partial derivatives are stored in the memory. The method continues with the step of evaluating in the processing circuit a total derivative of each subfunction. This is accomplished by generating a total derivative of each the subfunctions according to a predetermined method of operating the processing circuit. Each subfunction is related to other ones of the subfunctions by a tree structure to the Boolean function. The step of evaluating includes the step of obtaining in the processing circuit an evaluation of the Boolean function from a total derivative of the Boolean function from the tree by circuit modeled by the equation:

$$F(\vec{v}) = F(0) \oplus dF(\vec{v})$$

where F is the Boolean function, $\vec{v}$ a vector having a plurality of independent variables as elements, and dF the total derivative of the Boolean function from the tree.

In one embodiment the predetermined method of operating the processing circuit to generate a total derivative of each the subfunctions operates the processing circuit so that its operation is modeled by the equation:

$$dF = F_x\, dx \oplus F_y\, dy \oplus F_{xy}\, dx\, dy.$$

In another embodiment the predetermined method of operating the processing circuit to generate a total derivative of each the subfunctions operates the processing circuit so that its operation is modeled by the equation:

$$dF = \overline{dx}\, dy\, F_y + dx\, \overline{dy}\, F_x + dx\, dy\, (F_x \oplus F_y \oplus F_{xy}).$$

In still another embodiment the predetermined method of operating the processing circuit to generate a total derivative of each the subfunctions operates the processing circuit so that its operation is modeled by the equation:

$$dF = \overline{dx + \overline{dy} + \overline{F_y}} + \overline{\overline{dx} + dy + \overline{F_x}} + \overline{\overline{dx} + \overline{dy} +}$$

$$\overline{F_x \oplus F_y \oplus F_{xy}}.$$

In still another embodiment the predetermined method of operating the processing circuit to generate a total derivative of each the subfunctions operates the processing circuit so that its operation is modeled by the equation $$dF = (dx * F_x) \oplus (dy * (F_y \oplus (dx * F_{xy}))).$$

The step of evaluating is repeated for each new set of independent variables for which the Boolean function is evaluated.

The step of generating a total derivative of each the subfunctions according to a predetermined method of operating the processing circuit comprises the step operating a plurality of separate processing subcircuits. The plurality of subcircuits are organized into a tree circuit.

The step of generating a total derivative of each the subfunctions according to a predetermined method of operating the processing circuit comprises the step operating a central processing circuits and memory where a plurality of arrays are defined in the memory for storing independent variables, total derivatives of each of the subfunctions, and partial derivatives of each of the subfunctions. The plurality of subcircuits are organized into a tree circuit. The central processing circuit operates upon the arrays to relate elements of the arrays in a tree relationship using the predetermined method for relating each element in that one of the arrays for storing total derivatives to other elements in the one array.

The invention and its various embodiments are better visualized by now turning to the following drawings where like elements are referenced by like numerals.

BRIEF DESCRIPTION OF THE DRAWINGS

FIG. 4 is a diagrammatic depiction of a processing element used at a node in a tree structure according to the invention.

FIG. 5 is a diagrammatic depiction of an arbitrarily large tree structure for processing complex Boolean functions according to the invention.

FIG. 6 is a block diagram of the combination of a host computer and a tree structure in which the invention may be implemented in a first class of embodiments.

Figure 1:
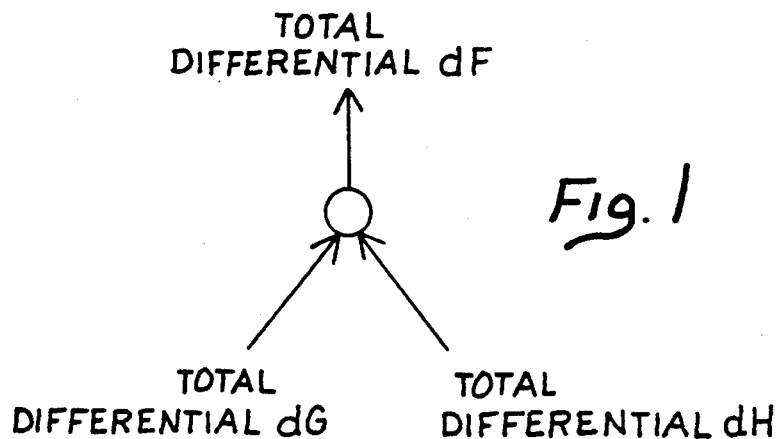
FIG. 1 is a symbolic depiction of the methodology of the invention as practiced at a single node.

The invention can better be understood by now turning to the following detailed description.

DETAILED DESCRIPTION OF THE PREFERRED EMBODIMENTS

Arbitrary and complex Boolean functions can be evaluated at high speed and with a minimal amount of memory by evaluating the total derivatives of the subfunctions out of which any given Boolean function is built. The Boolean function is then generated from its total derivative. The total derivative of any binary or two input Boolean function is defined by a method dependent only on the inputs and the partial derivatives of the subfunction. By combining the subfunctions in a binary tree, a Boolean function of any complexity can be built up. By using a full binary tree structure in a processing circuit or memory organization, the method is generalized to accommodate all possible Boolean functions. A processing element may be devised to generate the total derivative of each subfunction in a tree circuit of such processing elements, or arrays may be defined in a general purpose computer and elements in the array generated according to a processing methodology which assumes a tree relationship between elements in the array.

The invention is based on the total differential of a Boolean function. As will be described below this enables fast processing of Boolean functions in a small, general purpose computer under software control. An efficient process is described that implements the methodology with bit-level parallelism. Numerous sample process runs summarized in Table 3 below show that, compared to conventional techniques, an order of magnitude of performance improvement and an order of magnitude of memory space reduction is realized.

TABLE 1

Partial derivatives Fx, Fy and Fxy
for all Boolean Functions of Two Variables

| F | $F_x$ | $F_y$ | $F_{xy}$ |
|---|---|---|---|
| 0 | 0 | 0 | 0 |
| xy | y | x | 1 |
| x$\bar{y}$ | $\bar{y}$ | x | 1 |
| x | 1 | 0 | 0 |
| $\bar{x}$y | y | $\bar{x}$ | 1 |
| y | 0 | 1 | 0 |
| x ⊕ y | 1 | 1 | 0 |
| x + y | $\bar{y}$ | $\bar{x}$ | 1 |
| $\bar{x}\bar{y}$ | y | x | 1 |
| x ≡ y | 1 | 1 | 0 |
| $\bar{y}$ | 0 | 1 | 0 |
| x + $\bar{y}$ | y | $\bar{x}$ | 1 |
| $\bar{x}$ | 1 | 0 | 0 |
| $\bar{x}$ + y | $\bar{y}$ | x | 1 |
| $\bar{x}$ + $\bar{y}$ | y | x | 1 |
| 1 | 0 | 0 | 0 |

The invention is also implemented in a tree network structure with identical processing elements, each performing the total differential of a Boolean function. Two efficient hardware architectures for the processing elements are illustrated that permit cost-effective and real-time applications. The present invention is capable of processing an arbitrary Boolean function of any given depth, i.e. regardless of how many steps are required to break the function down to the single input variables. The disclosed network has the ability to process any Boolean function by dynamically reconfiguring its processing element's functionality. According to the invention an arbitrary Boolean function of two variables can be specified by only three bits, instead of the four bits required in the traditional approach. As will be seen this significantly reduces the hardware costs and increases the speed of processing.

First, a brief outline of Boolean calculus will be helpful in understanding how the concept is implemented in a machine and in a machine process. The total differential has been developed as a part of classical Boolean differential calculus. This calculus has been applied in various areas of circuit design, such as in hazard or fault detection, Boolean function decomposition, and circuit synthesis.

In traditional methods, Boolean functions are directly processed based on the function values themselves. According to the invention the total differentials of Boolean functions are used instead of using function values. The total differential, dF, of a Boolean function F is defined as the difference in the function value due to the difference in input values. For a Boolean function F(x,y) of two variables, x and y, for example, the total differential is defined in terms of the differences in input, dx and dy, as:

$$dF = F_x\,dx \oplus F_y\,dy \oplus F_{xy}\,dx\,dy, \tag{2}$$

where $F_x$, $F_y$ and $F_{xy}$ are the partial derivatives of F with respect to x, y and xy respectively. The symbol ⊕ represents an exclusive-or operation.

The partial derivative of F with respect to z, where z can be either x or y, is defined as:

$$F_z = F(x,y;z=1) \oplus F(x,y;z=0).$$

Function $F_z$ is obtained by the exclusive-or operation between two functions. The two functions are formed from F by setting z once to 0 and once to 1 in F(x,y).

For example, $F_x$ and $F_y$ for the OR function, i.e., a+b, are calculated in the following way:

$$F_x = (x+y) \oplus (\bar{x}+y) = y \oplus 1 = \bar{y} \tag{3}$$

$$F_y = (x+y) \oplus (x+\bar{y}) = x \oplus 1 = \bar{x} \tag{4}$$

The value of $F_{xy}$ is obtained from F by taking a partial derivative of $F_x$ with respect to y. Values of partial derivatives $F_x$, $F_y$ and $F_{xy}$ for all possible Boolean functions of two variables are calculated in the same way and the results are shown in Table 1 above.

Consider now a conceptual model of how an arbitrary Boolean function can be processed in a tree structure. Let F(x,y) be an arbitrary Boolean function of two variables and let x and y be dependent variables, i.e., x = G($x_1$, $x_2$) and y = H($y_1$, $y_2$). The total differentials of x and y, namely dG and dH, can be supplied as inputs to evaluate the total differential dF as symbolically depicted in FIG. 1 and specifically as set forth below.

$$dF(G(x_1,x_2),H(y_1,y_2)) = F_x\,dG(x_1,x_2) \oplus F_y\,dH(y_1,y_2) \oplus F_{xy}\,dG(x_1,x_2)dH(y_1,y_2) \tag{5}$$

Figure 2:
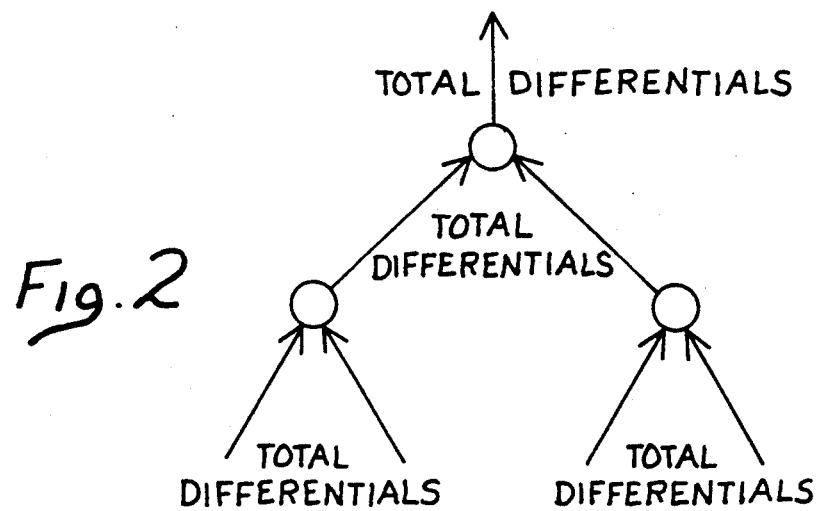
FIG. 2 is a symbolic depiction of the methodology of the invention as practiced within a portion of a tree network which is used for an arbitrarily complex Boolean function.

It follows from Equation (5) that the function values of G($x_1$, $x_2$) and H($y_1$, $y_2$) are not needed to calculate dF. The values of total differentials dG and dH are sufficient to evaluate dF. Therefore to process a Boolean function, we can use total differentials instead of the values of the functions themselves. Since total differentials in Equation (5) represent the total differentials between input and output, they can be combined in a tree network structure to process arbitrary complex Boolean functions as diagrammatically shown in FIG. 2. Equation (5) is performed at each node in this tree network.

Besides total differentials dF, dG and dH, Equation (5) includes values of partial derivatives $F_x$, $F_y$ and $F_{xy}$. In general, these partial derivatives are not constant, and their values will depend on inputs to the function. The following two stage process uses the values of $F_x$, $F_y$ and $F_{xy}$ which can be treated as constants. The two stages in the processing of a Boolean function F are: (1) initialization and (2) evaluation.

During the initialization stage, the function is processed with all the independent variables set to 0. The result is an initial value, denoted as F(0). Next, the partial derivatives are calculated for all subfunctions in the function F. Partial derivatives of a subfunction are obtained from inputs to the subfunction, according to Table 1 above. The values of inputs are calculated during the generation of F(0). The initialization stage thus determines the initial value F(0) and partial derivatives for all subfunctions.

During the evaluation stage, the total differential dF(v) for an input vector, v, which is simply a n-tuple of input variables, is calculated from the total differentials of subfunctions using Equation (2). The calculation is performed in a bottom-up fashion, starting with independent variables. Because the initial value F(0) is calculated with independent variables set at 0, the total differential dx of an independent variable x is equal to its value, i.e., x = dx. After the total differential dF(v) is calculated, the final function value F(v) can be obtained by an exclusive-or between F(0), the initial value of function F, and dF(v), the total differential of function F for input vector $\bar{v}$.

$$F(\bar{v}) = F(\bar{0}) \oplus dF(\bar{v}) \tag{6}$$

After initialization stage, the evaluation stage of the method can be repeated for an arbitrary number of inputs. The three partial derivatives for each subfunction in the function F, i.e., Fx, Fy and Fxy remain constant during the evaluation stage. They serve as the three parameters in Equation (2) that specify the functionality of a Boolean function being processed. Any one of the sixteen Boolean functions can be specified by these three values.

With the above concepts in mind, consider now how the process will be implemented in a tree structure. As an example, let E be the following Boolean function with eight input variables:

$$E(x,y,z,t,u,v,w,s) = (\overline{\overline{xy} + \overline{z}\,t}) \oplus ((u \equiv v)\,(\overline{w}+s)). \quad (7)$$

Any other function could have been chosen equally as well to concretely illustrate the concept in modeled form and no significance should be attached to the specific form of E.

As stated above the methodology is performed in two stages, the initialization stage and the evaluation stage. During the initialization stage, initial value $E(0,0,0,0,0,0,0,0)$ and partial derivatives for all subfunctions are calculated. The evaluation stage processes E for a specific input word.

Figure 3:
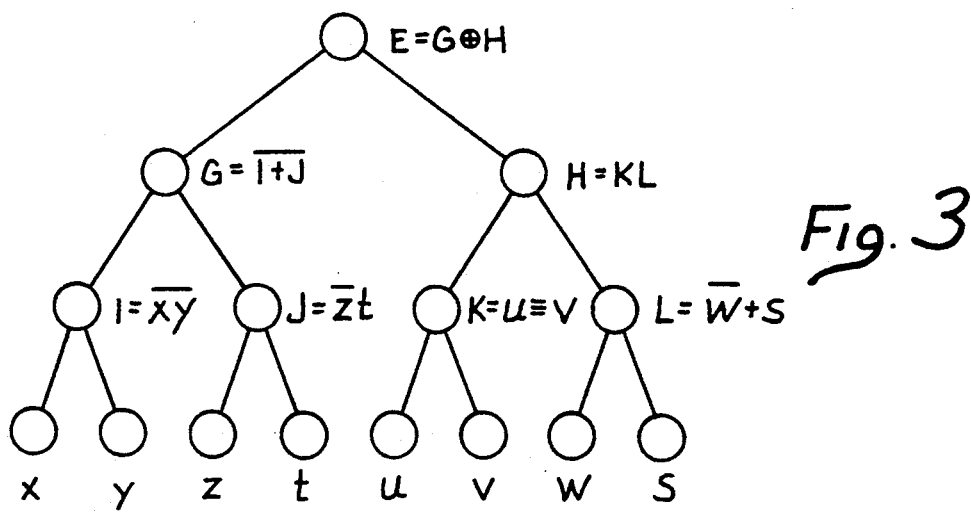
FIG. 3 is a tree structure for implementing the processing of the Boolean example shown in equation 7.

The first step of the initialization stage is to break E down into its subfunctions, i.e., sets of Boolean functions of two variables. Function E can be easily represented as a tree structure as shown in FIG. 3.

$$\overline{E(G, H)} = G \oplus H$$

$$G(I, J) = \overline{I + J}$$

$$H(K, L) = KL$$

$$I(x, y) = \overline{xy}$$

$$J(z, t) = \overline{z}t$$

$$K(u, v) = u \equiv v$$

$$L(w, s) = \overline{w} + s$$

During the second step we compute the function values with their independent variables being 0:

$$I(0,0) = 1,$$

$$J(0,0) = 0,$$

$$K(0,0) = 1,$$

$$L(0,0) = 1,$$

$$G(I,J) = 0,$$

$$H(K,L) = 1,$$

$$E(G,H) = 1.$$

This step produces the initial value $E(0,0,0,0,0,0,0,0)$.

In the third step the partial derivatives for each Boolean function are computed from the values of its inputs, according to Table 1. The detailed calculations for $G_x$, $G_y$ and $G_{xy}$ are:

$$G(I,J) = \overline{I + J} = \overline{I}\,\overline{J}$$

$$G_x = \overline{y} = G_I = \overline{J} = 1$$

$$G_y = \overline{x} = G_J = \overline{I} = 0$$

$$G_{xy} = G_{IJ} = 1$$

Similarly, we compute partial derivatives for functions E, H, L, K, J and I. Partial derivatives for all functions in Boolean function E are shown in Table 2. This concludes the initialization stage.

TABLE 2

| Partial Derivatives of the function of Equation 7 | | | |
|---|---|---|---|
| F | $F_x$ | $F_y$ | $F_{xy}$ |
| E | 1 | 1 | 0 |
| G | 1 | 0 | 1 |
| H | 1 | 1 | 1 |
| I | 0 | 0 | 1 |
| J | 0 | 1 | 1 |
| K | 1 | 1 | 0 |
| L | 1 | 0 | 1 |

Once partial derivatives are calculated, they do not change while the value of E is being processed for different input values.

The total differential of independent variables is equal to their value, i.e., $x = dx$, $y = dy$, ..., and $s = ds$. The total differentials for functions I, J, K, L, G, H and E are:

$$dI = I_x\,x \oplus I_y\,y \oplus I_{xy}\,x\,y = 0*1 \oplus 0*0 \oplus 1*1*0 = 0$$

$$dJ = J_x\,z \oplus J_y\,t \oplus J_{xy}\,z\,t = 0*1 \oplus 1*0 \oplus 1*1*0 = 0$$

$$dK = K_x\,u \oplus K_y\,v \oplus K_{xy}\,u\,v = 1*1 \oplus 1*0 \oplus 0*1*0 = 1$$

$$dL = L_x\,w \oplus L_y\,s \oplus L_{xy}\,w\,s = 1*1 \oplus 0*0 \oplus 1*1*0 = 1$$

$$dG = G_x\,dI \oplus G_y\,dJ \oplus G_{xy}\,dI\,dJ = 1*0 \oplus 0*0 \oplus 1*0*0 = 0$$

$$dH = H_x\,dK \oplus H_y\,dL \oplus H_{xy}\,dK\,dL = 1*1 \oplus 1*1 \oplus 1*1*1 = 1$$

$$dE = E_x\,dG \oplus E_y\,dH \oplus E_{xy}\,dG\,dH = 1*0 \oplus 1*1 \oplus 0*0*1 = 1$$

Since the total differential $dE(1,0,1,0,1,0,1,0)$ is defined as the difference between $E(1,0,1,0,1,0,1,0)$ and $E(0,0,0,0,0,0,0,0)$, the value of $E(1,0,1,0,1,0,1,0)$ is obtained by an additional exclusive-or of both:

$$E(1,0,1,0,1,0,1,0) = E(0,0,0,0,0,0,0,0) \oplus dE(1,0,1,0,1,0,1,0) = 1 \oplus 1 = 0$$

The total differential of a Boolean function of two variables, as represented in Equation (2), is the operation performed in a node in the tree network. Consider now a processing element for a node in the tree network, how the network based on such processing elements is constructed, and how the entire network is interfaced with a host computer.

The processing element (PE) carries out the computation of the total differential in Equation (2). There are six signals input to every processing element as diagrammatically depicted in FIG. 4:

two inputs, dx and dy;

one output, dF; and three control signals, $F_x$, $F_y$ and $F_{xy}$.

The outputs of two processing elements can be used as a pair of inputs to another processing element at a higher level in the tree network. As diagrammatically depicted in FIG. 5 an arbitrarily large tree network of processing elements is constructed to process arbitrarily complex Boolean functions. Inputs of the first processing elements at the bottom-most level of the tree are used to supply values of independent variables. Output from the topmost processing element provides the total differential of the entire Boolean function. All the processing elements on the same level of the tree can be evaluated in parallel.

Processing of Boolean functions is performed in two stages. A host computer 10 including a memory 11 illustrated in FIG. 6 performs the initialization stage. The tree network 14 of processing elements performs the evaluation stage. The tree network 14 and the host computer 10 are interfaced through either a simple special-purpose hardware chip, or a commercial interfacing chip 12 (e.g., an interface controller) which is coupled to host computer 10 through bus 13. The data/control or communication between Interface controller 12 and tree structure 14 is conducted by conventional handshake control.

In case of using a special-purpose interface controller, this controller can be easily designed and implemented using a finite state machine (FSM). This interface controller can be implemented as a part of the tree network. A FSM controller 12 is connected to both host computer 10 and tree network 14 through the system control bus 15 as shown in FIG. 6.

As discussed below there are eight control signals, four inputs into FSM controller 12 and four outputs of controller 12, which form the conventional handshake control between the host computer (i.e., host) and the tree network (i.e., tree). The basic control scheme consists of the following four steps:

1) When host computer 10 finishes the first stage initialization, it sends a signal, INVOKE-TREE (i.e., a logic "high") to FSM controller 12. FSM controller 12 correspondingly sends a TREE-INITIALIZATION signal (a logic "high") to tree network 14 to initialize the network for computation.

2) When tree network 14 is ready (e.g., it finishes the last computation and is ready to accept data for a new computation), tree network 14 sends back a signal, TREE-READY (i.e., a logic "high") to FSM controller 12. FSM controller 12 thus sends host computer 10 a signal, READY (a logic "high") to inform host computer 10 to release the initialization stage results to tree network 14.

3) When the tree network finishes its computation, it sends a signal, TREE-WORK FINISHED (i.e., a logic "high") to FSM controller 12. FSM controller 12 then sends a signal, FINISHED (a logic "high") to host computer 10 to inform host computer 10 to be ready to accept the final results from tree network 14.

4) When host computer 10 receives a FINISHED signal, it will prepare itself to accept the results. If it is ready, it issues signal SEND RESULTS (i.e., a logic "high") to FSM controller 12. FSM controller 12 then informs tree network 14 to release the final computing results back to host computer 10 through system data bus 13.

Figure 8:
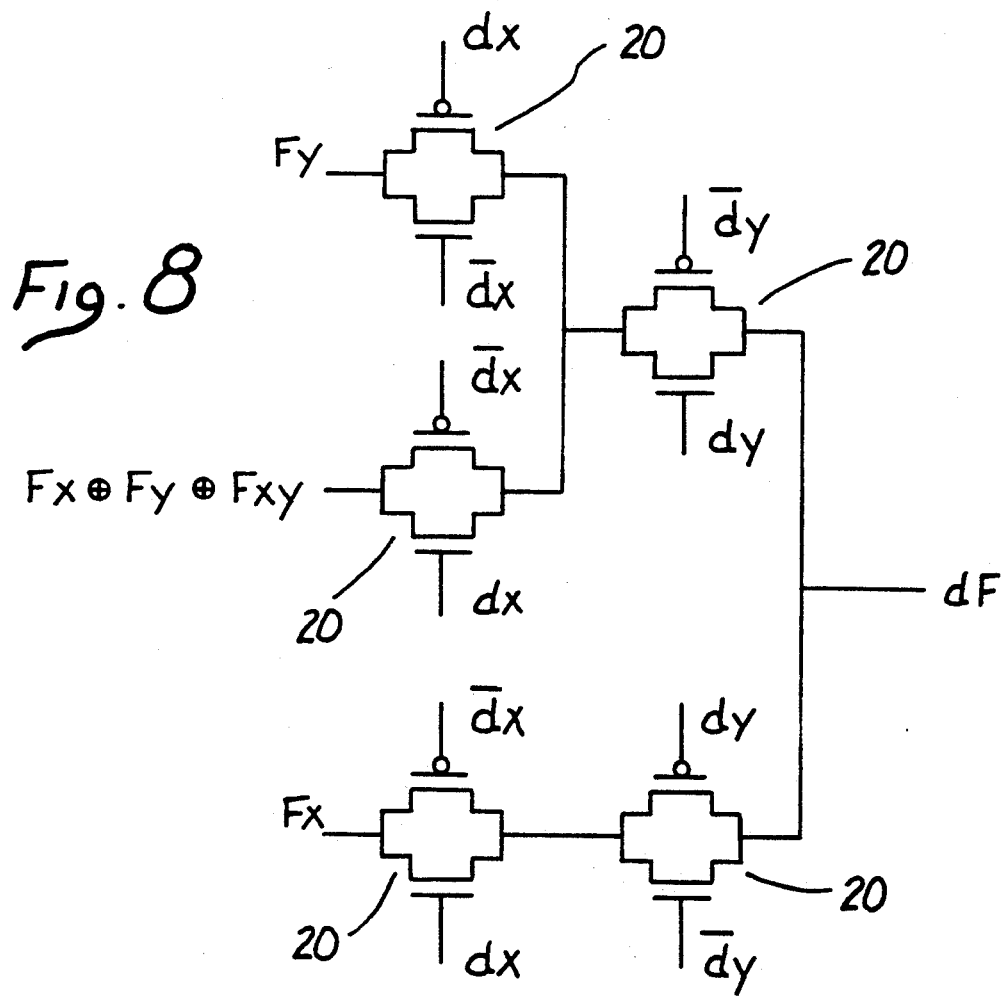
FIG. 8 is a schematic of the first embodiment of one of the processing elements in which the switch of FIG. 7 is used.

In a first embodiment illustrated in FIG. 8 the processing element uses five switches and two inverters which contain a total of 14 transistors. Equation (2) for the total differential includes two instances of exclusive-or operation. Since the implementation of exclusive-or operation in CMOS is relatively expensive, the model of Equation (2) is transformed in the illustrated embodiment into a logically equivalent form:

$$dF = \overline{dx}\ dyF_y + dx\ \overline{dy}F_x + dx\ dy(F_x \oplus F_y \oplus F_{xy}) \quad (8)$$

This Equation (8) leads to an efficient implementation with less expensive logic switches. The two transistor switch 20, S(a,c) of FIG. 7 performs a function modeled by:

$$S(a,c) = ac.$$

Figure 7:
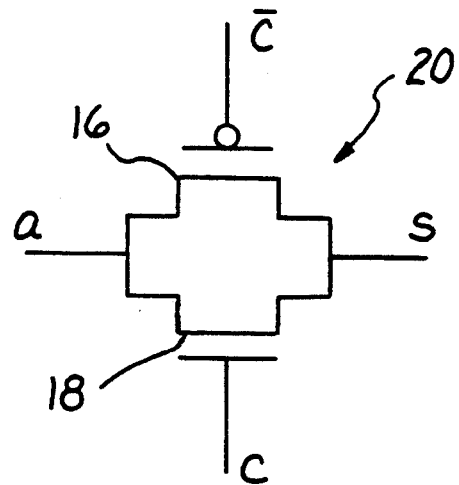
FIG. 7 is a schematic of a CMOS switch used in a first embodiment of the processing elements.

This function is implemented in two transistors 16 and 18 as shown in FIG. 7. The general equation (8) is then implemented with five switches 20 as:

$$dF = S(S(F_y, \overline{dx}) + S(F_x \oplus F_y \oplus F_{xy}, dx), dy) + S(S(F_x, dx), \overline{dy})$$

as shown in FIG. 8. Two additional inverters are required to calculate dx and dy. The value $F_x \oplus F_y \oplus F_{xy}$ is a constant for a given Boolean function. It is precalculated by host computer 10. In Equation (2), one of the control signals is $F_{xy}$. In this new formulation, the original control signal, $F_{xy}$, is replaced by $F_x \oplus F_y \oplus F_{xy}$.

Figure 9:
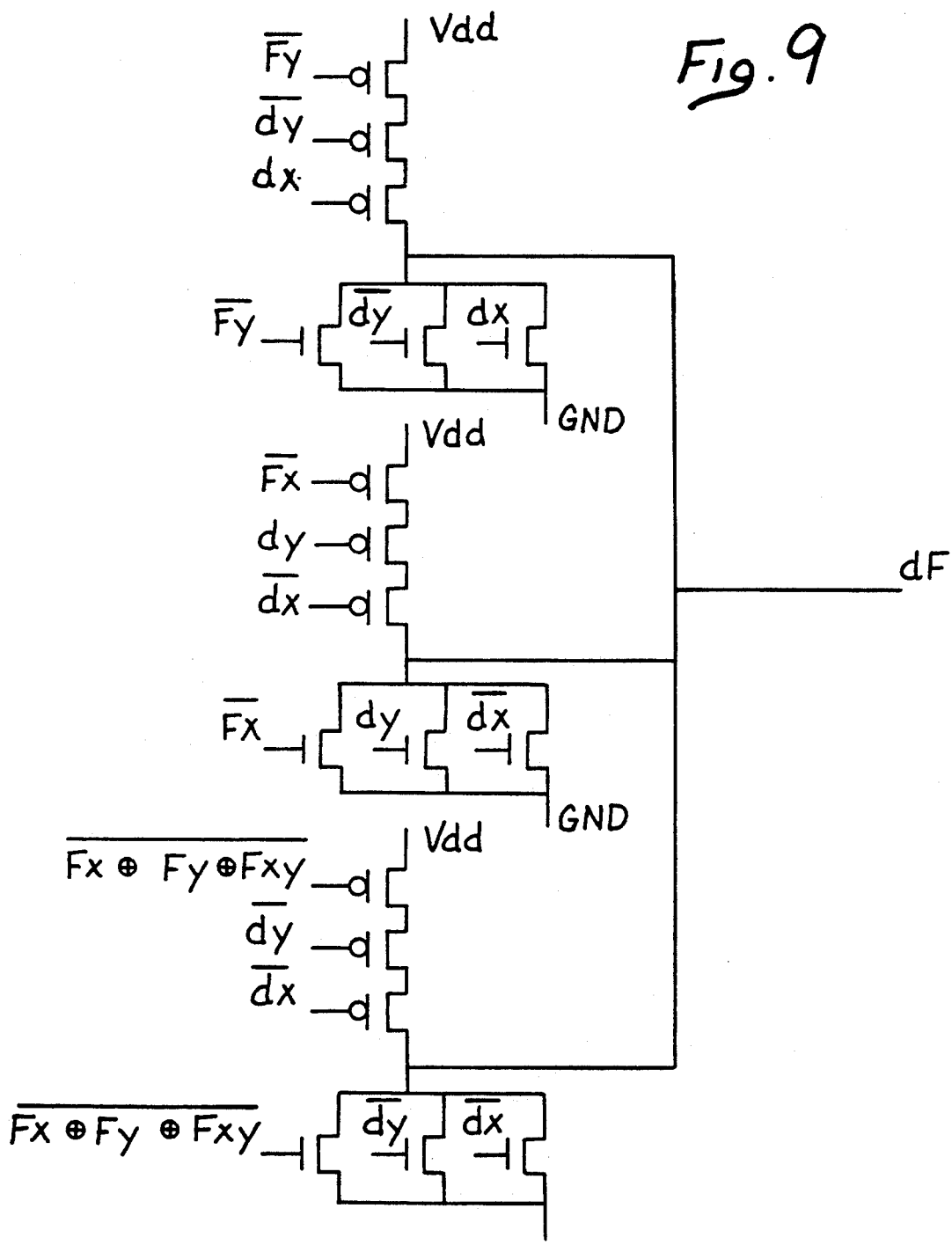
FIG. 9 is a schematic of a second embodiment of one of the processing elements.

In a second embodiment illustrated in FIG. 9 the processing element uses three, 3-input NOR gates and two inverters, which contain a total of 22 transistors. In this case, the general equation for the total differential is transformed to:

$$dF = \overline{dx + \overline{dy} + \overline{F_y}} + \overline{\overline{dx} + dy + \overline{F_x}} + \overline{dx + dy +} \quad (9)$$
$$\overline{F_x \oplus F_y \oplus F_{xy}}.$$

The values of $F_x$, $F_y$, and $F_x \oplus F_y \oplus F_{xy}$ are supplied as control signals by the host computer 10 instead of being control signals in the original process, based on Fx, Fy and Fxy. A circuit in CMOS that implements Equation (9) is shown in FIG. 9 and is exactly modeled by equation 9 as three circuit blocks corresponding to the three quantities which are combined by the OR function.

The above implementations minimize the number of inputs and outputs. Different variations are possible, such as reducing the number of transistors at the expense of more I/O signals, or reducing the computing time at the expense of more I/O signals and more transistors. Each of these possible variations must be expressly understood as included within the scope of the invention.

The implementation of the process in a general purpose computer under software control is described below. Equation (1) for the total differential can be directly expressed in a programming language that supports parallel bit-wise Boolean operations. That is, a word may be acted upon as a unit, each bit of which corresponds to a different set of input values. Using the symbol * to represent Boolean AND operation and the symbol + to represent Boolean exclusive-or operation, Equation (1) is expressed as:

$$dF = (dx*F_x) \oplus (dy*(F_y \oplus (dx*F_{xy}))) \quad (10)$$

The values of $F_x$, $F_y$ and $F_{xy}$ are precalculated for each Boolean function of two input variables during the initialization stage. According to the invention the processing of a Boolean function of two variables involves the following:

five operands: dx, dy, $F_x$, $F_y$ and $F_{xy}$;

three Boolean AND operations;
two Boolean exclusive-or operations; and
the result dF.

Assume for example that a computer word is 32 bits in length. Traditionally, an entire computer word is used to process one Boolean function. For example, the expression in Equation (10) produces only one result. Normally, a computer does bit-wise AND and bit-wise exclusive-or operations on the word (e.g., 32 bits) in one instruction. In our implementation, we take advantage of this machine feature to increase execution speed and reduce memory space.

Using traditional techniques, the code to calculate dF in Equation (10) produces one result. In contrast in the invention all the bits of an entire word are used to simultaneously process 32 Boolean functions. If the ith bit in the operands is initialized to represent the ith Boolean function, then the ith bit of dF will be the result of the ith total differential Boolean function. All 32 Boolean functions in one word are completely independent. Gain in execution speed and memory reduction are proportional to the length of a computer word. In general, on an N-bit computer, N Boolean functions can be processed simultaneously with the same memory requirement and in the same execution time interval as in the traditional techniques.

Arbitrarily large Boolean functions are processed by feeding the output of one stage to the input of the next stage. Any Boolean function can be represented by a binary tree data structure as described in connection with FIG. 3. Each node in a binary tree is connected to at most two children or lower level nodes. A binary tree of depth k is called a full binary tree if it has $2^K-1$ nodes. For example, the tree in FIG. 3 is a full binary tree of depth four and it contains 15 nodes.

In the following discussion, assume that all 32 Boolean functions to be evaluated are represented as full binary trees of the same depth. A binary tree that is not full can always be transformed to a full binary tree. This can be done by attaching redundant nodes to make the tree full. These redundant nodes do not affect the result of the original Boolean function. They are used only for passing along input values without modification. The 32 Boolean functions, represented as 32 full binary trees of the same depth, are grouped and processed simultaneously. This offers maximum efficiency in the process. Less efficiency may occur when trees are not full.

Figure 10:
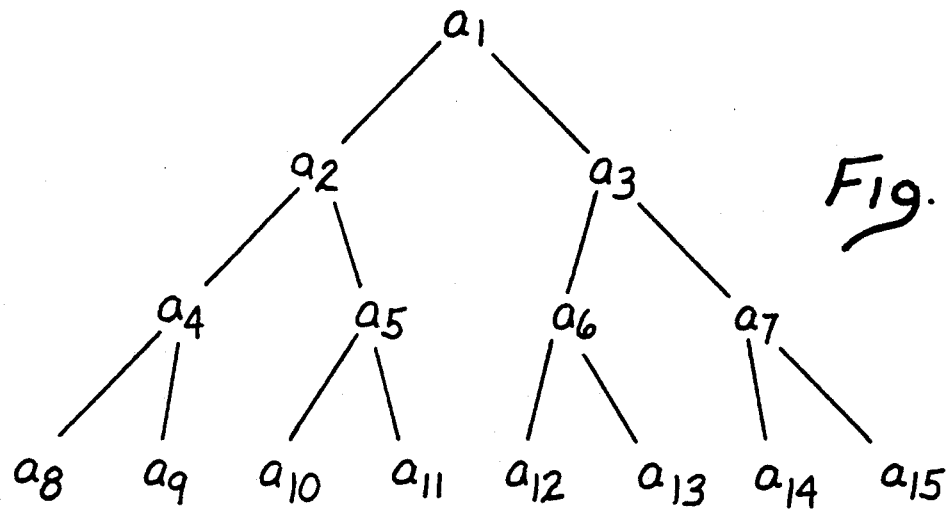
FIG. 10 is a diagram showing the form of an array for the arrays df, dfp and dfxy.

A binary tree can be stored in a memory structure or organization called a heap. A heap is a tree data structure represented by an array. The nth element of an array a is denoted as a[n]. In a heap, element a[j] has two children, elements a[2j] and a[2j+1]. The highest level of a heap has index, j=1. See the heap with depth 4 shown in FIG. 10.

Three heaps are needed to process arbitrary Boolean functions. The heaps are denoted as array df, array fp and array fxy, where N is the number of input variables; df is the array of total differentials dx, dy, dF; fp is the array of the partial differentials $F_x$ and $F_y$; and fxy is the array of the partial differentials $F_{xy}$.

For Boolean functions with N inputs, the total differentials, i.e., dF, dx and dy in Equation (1), are represented by heap df with 2*N−1 array elements. This includes the ultimate result dF at df[1], the intermediate or lower level dF's from the lower nodes and the N input variables. The elements df[N] to df[2*N−1] of the heap df contain the values of independent input variables. Intermediate total differentials are stored in elements df[2] to df[N−1]. The element df[1] contains the final total differential for each of the Boolean functions in the 32 bit word.

The values of partial derivatives $F_x$ and $F_y$ for all subfunctions are stored in the heap fp which has 2*N−1 array elements. The values of a partial derivative $F_{xy}$ for all subfunctions are represented by the heap fxy with N−1 elements.

Each array element requires 32 bits since it is assumed in the illustrated embodiment that parallel bit processing is being practiced to simultaneously evaluate 32 Boolean functions. To evaluate a total differential dF for a Boolean function that is designated in the ith bit of the jth element in df[j], j=1,2, ..., N−1, the values in Equation (10) are placed according to the invention as follows:

dx is placed in the ith bit of df[2*j];

dy is placed in the ith bit of df[2*j+1];

$F_x$ is placed in the ith bit of fp[2*j];

$F_y$ is placed in the ith bit of fp[2*j+1];

$F_{xy}$ is placed in the ith bit of fxy[j]; and the result is placed in the ith bit of df[j].

Figure 11:
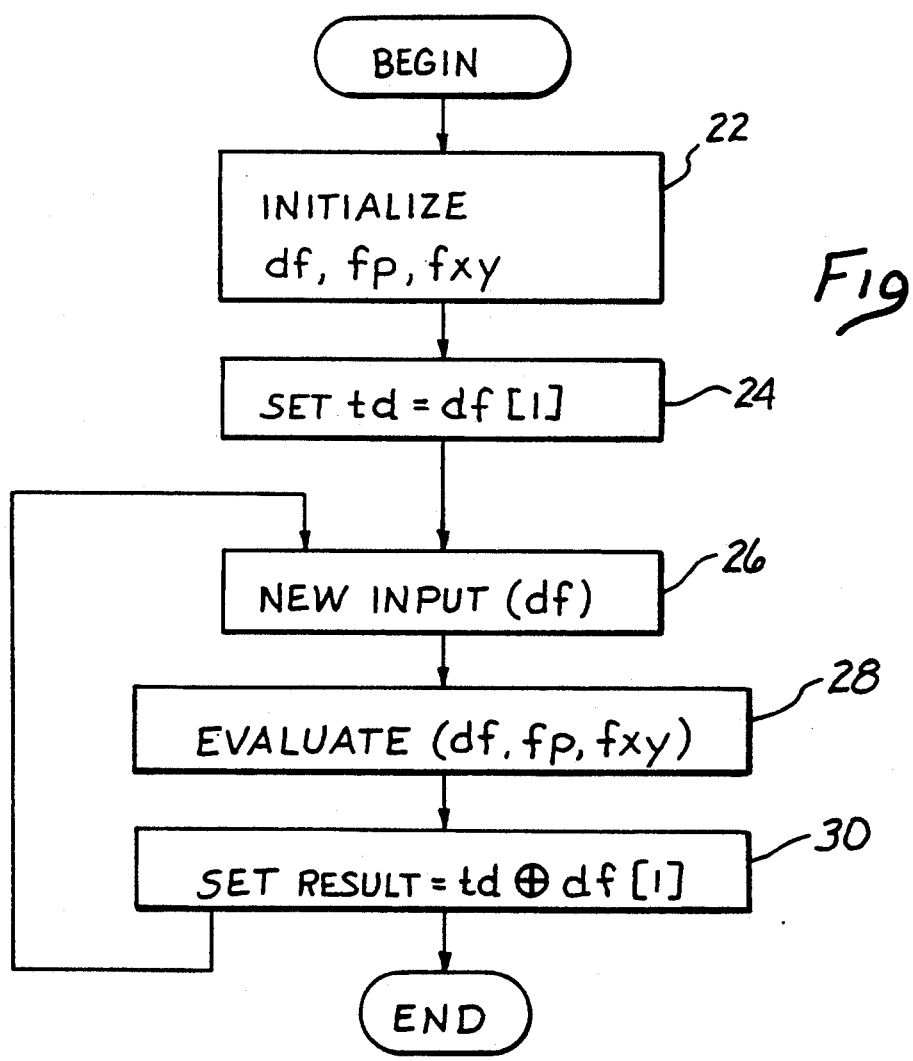
FIG. 11 is a flow diagram of the methodology where the total derivatives are generated in a general purpose computer.
Figure 14:
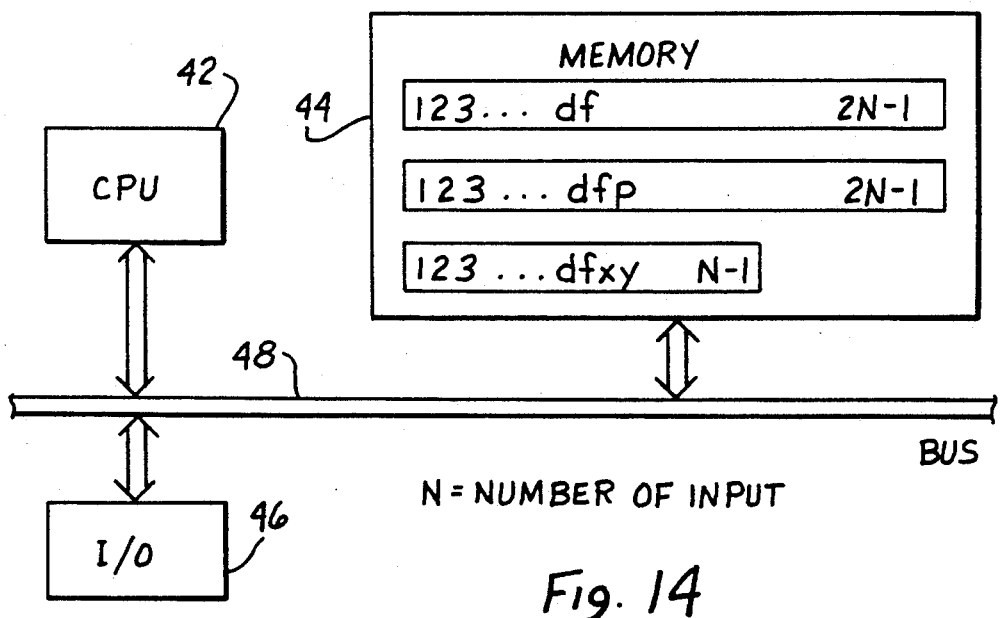
FIG. 14 is a block diagram of a circuit for performing the methodology shown in the flow diagrams of FIGS. 11-13.

FIG. 11 is the flow chart of a methodology to process any Boolean function using these memory array assignments. The methodology depicted is performed in the circuit of FIG. 14 which is a general purpose computer circuit wherein the memory has been organized according to the invention. The computer circuit comprises a conventional central processing unit (CPU) 42 coupled by means of bus 48 to a conventional input/output device or devices 46 and to a memory 44 having the arrays described below defined therein.

In FIG. 11 two main subroutines, INITIALIZE and EVALUATE, perform initialization stage and evaluation stage processes as described above. The subroutines, INITIALIZE, initializes all three heaps, df, fp and fxy. The value of the 32 Boolean functions with all their independent inputs being 0 are put in the 32 bits of element df[1] at step 22. The value of df[1] is stored in the variable, TD, at step 24. After the initialization stage, the functions are processed for each new set of inputs. The subroutine NEWINPUT sets all 32 bits of the elements df[N] through df[2*N−1] to the new values of the inputs at step 26. The core of the process is the subroutine EVALUATE at step 28 which stores the total differential results in the 32 bits of element df[1]. Because the result represents a difference from initial values, see Equation (5), an exclusive-or operation is performed on the corresponding 32 bits in TD in step 30 and the corresponding 32 bits in df[1]. The final results are stored in 32 bits of the variable, RESULT which is the value of the 32 Boolean functions corresponding to the input values assumed. Each bit in the variable, RESULT, is a value of one Boolean function for the given set of input variables. After initialization, the evaluation stage can be repeated for an arbitrary number of times to process Boolean functions for different inputs.

Figure 12:
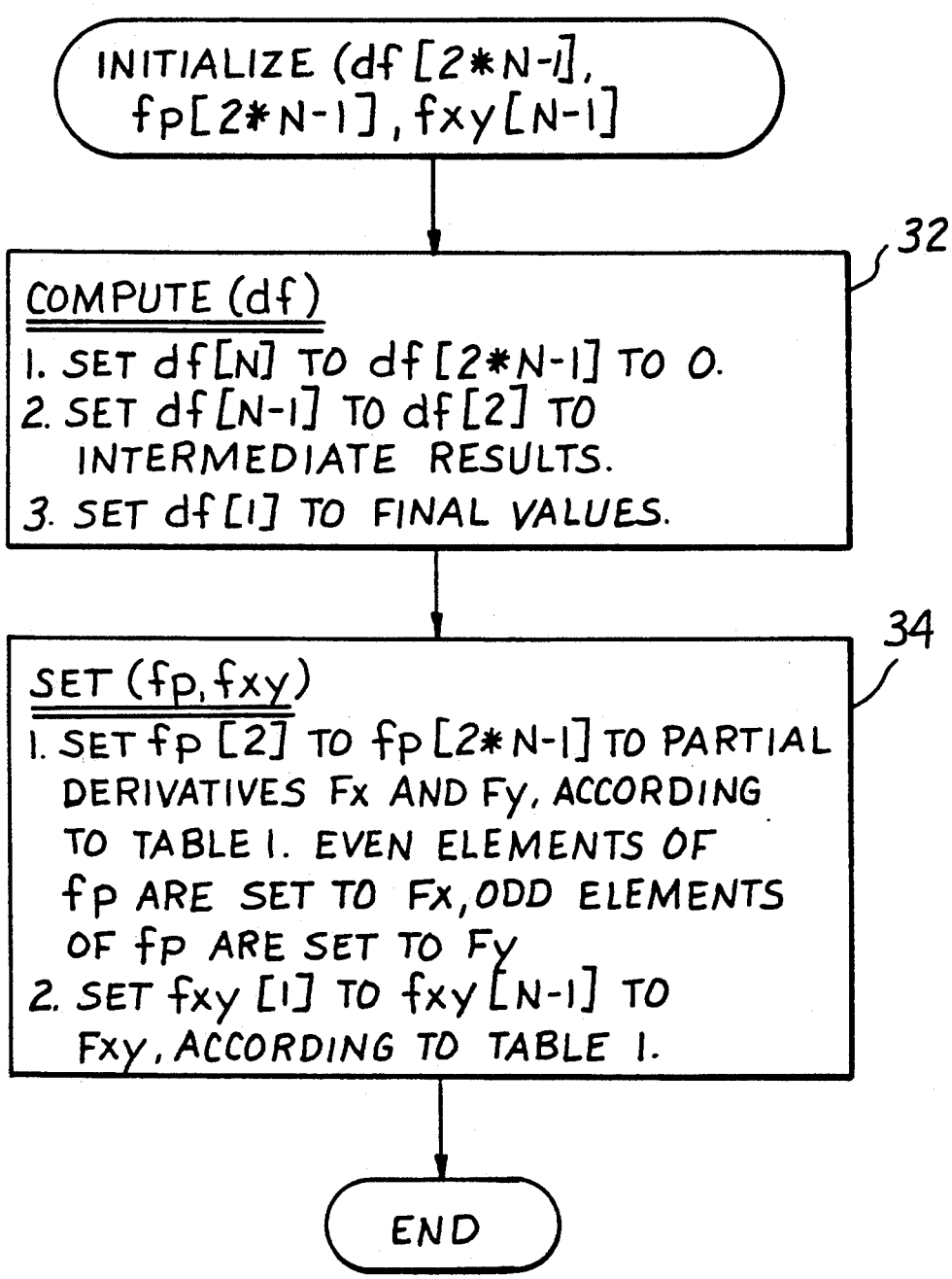
FIG. 12 is a flow diagram of the INITIALIZE routine of FIG. 11.

The subroutine, INITIALIZE, is diagrammatically depicted in the flowchart of FIG. 12. The subroutine generates the value of all Boolean functions being processed when all of the inputs are set equal to 0, and initializes heaps fp and fxy. The subroutine, COM- PUTE, at step 32 processes all Boolean functions with their independent variables being set equal 0. This can be done by any conventional method. The subroutine, COMPUTE, at step 32 stores the 32 final values of the Boolean expressions in 32 bits of element df[1] and in the process of evaluating df[1] for the initial 0 inputs, stores the initialized values of the subfunctions or lower level values of the binary tree in elements df[2] to df[N−1]. These intermediate results or subfunctions will be overwritten in heap df at step 28. The inputs, being 0 in this case, are stored in elements df[N] through df[2*N−1]. These initialized input values will also be overwritten in step 26.

The subroutine SET at step 34 in FIG. 12 initializes heaps fp and fxy by storing $F_x$, $F_y$ and $F_{xy}$ of Equation (10), corresponding to the subfunctions of heap df and the partial derivatives in Table 1.

Figure 13:
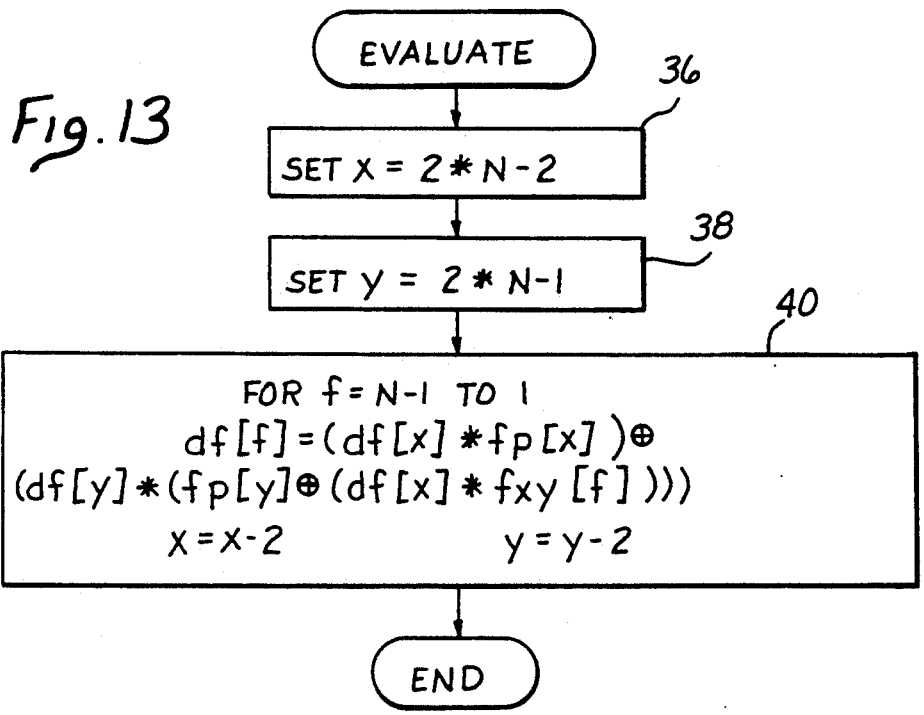
FIG. 13 is a flow diagram of the EVALUATE routine of FIG. 11.

The subroutine, EVALUATE, calculates dF for the elements df[N−1] to df[1] by applying Equation (10), as described in FIG. 13. For example, the indices x and y are initialized at steps 36 and 38. The heap elements df[j] are calculated from Equation (10) using the then stored contents of heaps df, fp and fxy corresponding to the input variables, $F_x$, $F_y$, and $F_{xy}$ as discussed above until df[N−1] through df[1] have been computed.

An optimization technique could be applied for Boolean functions that contain a large number of subfunctions. Since the total differential represents the change in the function value, further function processing can be stopped if this change is 0. For example, if both operands df[x] and df[y] in FIG. 13 are 0, then the result df[f] in FIG. 13 will also be 0. The calculation can be terminated, as soon as all unprocessed inputs become 0. This earlier termination of further redundant processing, as soon as both input total differentials of a Boolean function are 0, can save a great deal of computing time.

In the illustrated embodiment, the methodology has been run on a machine that has a 32-bit 25 Mhz Motorola 68030 Microprocessor. The machine performance is estimated at about 3.5 MIPS (million instructions per second).

Sample program runs and measurements have been performed on a large number of random Boolean functions of various sizes. The results are shown in Table 3. Column 1 shows that the number of Boolean Functions which was the number of top level or highest complexity Boolean functions in the run. Since each word in a machine in our example contains 32 bits, 32 Boolean functions were processed in all cases.

Column 2 shows the number of input variables in each top level Boolean function. Since top level Boolean functions are represented by the full binary trees, a top level Boolean function with N inputs has N−1 Boolean subfunctions.

Column 3 shows how many different random Boolean functions were generated.

Column 4 shows the number of randomly generated input vectors applied to each Boolean function. The total number of Boolean functions of all levels of complexity processed in each row in Table 3 can be calculated as the product of the number of Boolean functions times the number of input variables-1 times the number of different functions times the number of input vectors. The total number of functions processed per second is shown in column 6.

Column 5 shows the number of times the same function was processed, i.e., 0, 10, 20 and 30, i.e. the number of times that function processing was repeated. They are in multiples of ten. This repetition was necessary to increase the measurement accuracy since one execution takes only a small time period. Values under these four subcolumns are the measurement results in seconds. They were averaged over five runs. The column with 0 repetitions or processing shows the time spent on the initialization stage and on the generation of random functions and random input values.

Column 6 shows the millions of Boolean function operations per second, MBOPS, which was measured. The values for MBOPS are calculated as the total number of Boolean functions times 30, the maximum number of repeated processing, divided by the time to perform 30 processing. For example, the MBOPS value in the first row is calculated as: $32\times(8-1)\times 1024\times 32\times 30/(27.42-5.7)\text{sec}^{-1} = 10.14$ MBOPS.

This rate is an order of magnitude faster than previously used Boolean evaluation processes. A similar examination of the required memory usage also shows a decrease of an order of magnitude in the memory required to perform the processing.

Many alterations and modifications can be made by those having ordinary skill in the art without departing from the spirit and scope of the invention. For example, several examples of implementing the methodology based on the definition of the total derivative have been described. However, these illustrated embodiments do not exhaust all the possible ways in which the same basic methodology may be implemented either in custom hardware or in a general purpose computer. Therefore, it must be understood that the illustrated embodiments are set forth only for the purposes of example and clarity of illustration and do not limit the invention defined in the following claims, which include all equivalents and means for performing substantially the same function to get the same result even in a substantially different way.

We claim:

1. An apparatus for processing a complex Boolean function comprised of a plurality of Boolean subfunctions of corresponding variables, said plurality of Boolean subfunctions being related to each other in a hierarchic order, at least one of said Boolean subfunctions

TABLE 3

Performance Measurements on a Machine with a 25 Mhz Motorola 68030 Microprocessor; all data are the average of five runs (Time Units: seconds).

| Number of Boolean Functions | Number of Input Variables | Number of Different Functions | Number of Input Vectors | Number of Times the Same Function Was Evaluated | | | | MBOPS |
|---|---|---|---|---|---|---|---|---|
| | | | | 0 | 10 | 20 | 30 | |
| 32 | 8 | 32 | 1024 | 5.7 | 12.92 | 20.05 | 27.42 | 10.14 |
| 32 | 64 | 16 | 256 | 6.65 | 14.91 | 23.03 | 31.39 | 9.98 |
| 32 | 512 | 8 | 64 | 11.77 | 20.23 | 28.93 | 37.19 | 9.88 |
| 32 | 4096 | 4 | 16 | 32.72 | 41.45 | 49.87 | 57.95 | 9.97 | being a function of two variables, a lowest level of said hierarchic order of Boolean functions having independent variables, each higher level of said hierarchic order of Boolean functions having as its corresponding variables two lower order Boolean subfunctions until said complex Boolean is obtained, said apparatus comprising:

a host computer for generating and storing for each node partial differential signals corresponding to partial derivatives of each of said Boolean subfunctions with respect to the subfunctions of the next lower level;

a tree structure means for receiving a plurality of input signals at each node corresponding to said independent variables and for generating total differential signals corresponding to total differentials of each of said Boolean subfunctions at each level and ultimately a total differential signal corresponding to said complex Boolean function, each node controlled by said partial derivatives, wherein said host computer receives said total differential signal corresponding to said complex Boolean function and generates a signal corresponding to the value of said complex Boolean function evaluated at said plurality of independent variables input at the lowest level of said tree structure means according to a predetermined algorithm that operates on an initial value signal and said total differential signal, said initial value signal being the value of said function at a zero input of said independent variables; and controller means coupling said host computer and said tree structure means for communicating at least said plurality of partial derivatives signals from said host computer to said tree structure means, and for passing computation signals from said tree structure means to said host computer, whereby said complex Boolean function is evaluated at high speed and minimal use of memory.

2. The apparatus of claim 1 wherein said tree structure means comprises a plurality of identical processing means organized and coupled with one another in a tree structure.

3. The apparatus of claim 2 wherein said tree structure is a binary tree structure, each said processing means having only two inputs.

4. The apparatus of claim 3 wherein said binary tree structure is a full binary tree structure.

5. The apparatus of claim 2 wherein each said processing means at each node is a logic circuit corresponding to one of said Boolean subfunctions at each said level and having inputs corresponding to the differentials of a next lower order one of said Boolean subfunctions at a next lower level, and wherein said host computer generates said partial differential signals corresponding to partial derivatives, Fx, Fy and Fxy, of said Boolean subfunction evaluated by said processing means at each level, said partial differential signals corresponding to said partial derivatives Fx, Fy and Fxy being coupled to said processing means at each level, said partial differential signals corresponding to said partial derivatives Fx, Fy and Fxy being selectively and logically combined in said processing means with each other at each level with inputs corresponding to the differentials of a next lower order one of said Boolean subfunctions at a next lower level within said tree structure means to generate a total differential signal of said Boolean subfunction evaluated by said processing means at said corresponding level.

6. The apparatus of claim 5 wherein each said processing means combines said inputs dx and dy with said signals corresponding to said partial derivatives $F_x$, $F_y$ and $F_{xy}$ as modeled by the equation:

$$dF = F_x dx \oplus F_y dy \oplus F_{xy} dx\, dy,$$

where F is said Boolean subfunction evaluated by said processing means.

7. The apparatus of claim 5 wherein each said processing means combines said inputs dx and dy with said signals corresponding to said partial derivatives $F_x$, $F_y$ and $F_{xy}$ as modeled by the equation:

$$dF = F_x \overline{dx}\, dy + F_y dx\, \overline{dy} + (F_x \oplus F_y \oplus F_{xy}) dx\, dy,$$

where F is said Boolean subfunction evaluated by said processing means.

8. The apparatus of claim 5 wherein each said processing means combines said inputs dx and dy with said signals corresponding to said partial derivatives $F_x$, $F_y$ and $F_{xy}$ as modeled by the equation:

$$dF = \overline{dx + \overline{dy} + \overline{F_y}} + \overline{\overline{dx} + dy + \overline{F_x}} + \overline{\overline{dx} + \overline{dy} + \overline{F_x \oplus F_y \oplus F_{xy}}}.$$

where F is said Boolean subfunction evaluated by said processing means.

9. The apparatus of claim 5 wherein each said processing means comprises a plurality of switch circuits, each said switch circuit having an input terminal for receiving said partial differential signal corresponding to said partial derivatives of said corresponding Boolean subfunction of said complex Boolean function evaluated by said processing means, two control gates controlled by one of said inputs dx and dy, and an output terminal, said plurality of switches being combined in said processing means to generate a total derivative of said Boolean subfunction evaluated by said processing means, said plurality of switches combined in said processing means to model the equation, $$dF = S(S(F_y,\ \overline{dx}) + S(F_x \oplus F_y \oplus F_{xy},\ dx),\ dy) + S(S(F_x,\ dx),\ \overline{dy})$$

where S (a, c) = a*c and S is a switching function which transmits the value of a at the input of the switch to the output of the switch only when c is true.

10. The apparatus of claim 5 wherein each said processing means comprises three 3-input NOR gates and two inverters combined to logically operate as modeled by equation $$dF = \overline{dx + \overline{dy} + \overline{F_y}} + \overline{\overline{dx} + dy + \overline{F_x}} + \overline{\overline{dx} + \overline{dy} + \overline{F_x \oplus F_y \oplus F_{xy}}}.$$

11. An apparatus for processing an arbitrary, complex Boolean function comprised of a plurality of subfunctions, said Boolean subfunctions being functions of corresponding input variables at each level of an actual or virtual logic tree, said logic tree comprising a plurality of levels with one or more actual or virtual nodes at each level, said plurality of Boolean subfunctions being related to each other in a hierarchic order corresponding to said levels within said logic tree, each of said Boolean subfunctions being a function of two variables, a lowest level of said hierarchic order of Boolean functions having independent variables, each higher level of said hierarchic order of Boolean functions at a next higher level within said logic tree having as its corresponding variables two total differential signals of the next lower order Boolean subfunctions at the next lower level within said logic tree until said complex Boolean is obtained, said apparatus comprising:

means for receiving and storing a plurality of inputs corresponding to said independent variables at said lowest level within said logic tree;

means for generating and storing a plurality of partial differential signals corresponding to partial derivatives of each of said Boolean subfunctions at each node and at each level with said logic tree;

means for generating and storing a plurality of total differential signals corresponding to total derivatives of each of said subfunctions at each node at each level within said logic tree according to a predetermined rule;

means for logically combining said plurality of signals corresponding to said total derivatives at each node at each level within said logic tree, partial derivatives and inputs combined to generate a total derivative of said Boolean subfunctions at each node at each level within said logic tree, said means for logically combining being coupled to and communicating with said means for receiving and storing a plurality of inputs, to said means for generating and storing a plurality of partial differential signals, and to said means for generating and storing a plurality of total differential signals; and means for generating a signal corresponding to that value of said Boolean function at said corresponding plurality of inputs corresponding to said independent variables from a zero initial value signal and said total differential signal at the highest level of said logic tree, whereby said complex Boolean function is evaluated at high speed and minimal use of memory.

12. The apparatus of claim 11 wherein said means for generating and storing said plurality of partial differential signals corresponding to said partial derivatives of each of said subfunctions at each node and level of said logic tree comprises a first portion of a memory and a processor circuit for retrieving said partial differential signals stored in said first portion of said memory corresponding to each said subfunction at each node and level of said logic tree and for storing said retrieved partial differential signals in an array, defined as fp and fxy, in said first portion of said memory;

wherein said means for generating said plurality of total differential signals at each node and level of said logic tree according to a predetermined rule comprises a second portion of said memory and said processor circuit, said processor circuit for generating said total differential signal of each said subfunction at each level and said second portion of said memory for storing said generated total differential signal of each said subfunction in an array, defined as df, in said memory; and wherein said means for combining said plurality of total differential signals, partial differential signals and inputs at each level comprises a third portion of said memory and processor circuit, wherein said processor circuit combines said plurality of total differential signals, partial differential signals and inputs at each node and level of said arrays, df, fp and fxy, stored in said memory to generate said total differential signal of said Boolean subfunctions and stores said total differential signals of said Boolean subfunctions in said third portion of said memory.

13. The apparatus of claim 12 wherein said array fp and fxy are two separate arrays stored in said first portion of said memory, wherein said partial differential signals corresponding to said partial derivatives Fx and Fy are stored in said array fp, and wherein said partial differential signals corresponding to said partial derivatives Fxy at each level for each said subfunction at each node and each level are stored in said array dfxy.

14. The apparatus of claim 11 wherein said means for generating that value of said Boolean function at said corresponding plurality of inputs comprises a memory and a processor circuit, wherein said processor circuit generates said value of said Boolean function F in said memory and processor circuit as modeled by the equation $$F(\vec{v}) = F(\vec{0}) \oplus dF(\vec{v})$$

where $\vec{v}$ is a data vector having as its elements said plurality of inputs at said value.

15. The apparatus of claim 11 wherein said means for generating a plurality total differential signals according to a predetermined rule comprises a memory and processor circuit and wherein said processor circuit generates said total differential signals for each subfunction by means modeled by equation $$dF = (dx * F_x) \oplus (dy * (F_y \oplus (dx * F_{xy}))).$$

16. The apparatus of claim 11 wherein said means for combining said plurality of total differential signals, said partial differential signals and inputs according to a tree structured logic to generate a total derivative of said Boolean function comprises a memory and a processor circuit wherein said tree structured logic is defined as full binary tree logic.

17. The apparatus of claim 16 wherein said memory and said full binary tree logic is organized in said memory in the form of an array df, and array fp, and an array fxy, where array df stores total differential signals corresponding to total derivatives of each of said subfunctions at each level for each node in said tree logic, where array fp stores partial differential signals corresponding to partial derivatives Fx and Fy for each node at each level in said tree logic, and where array dfxy stores partial differential signals corresponding to partial derivatives Fxy for each node at each level in said tree logic.

18. The apparatus of claim 17 wherein said means for generating a plurality total differential signals according to a predetermined rule comprises a memory and processor circuit and wherein said processor circuit generates said total differential signals for each subfunction by means modeled by equation $$dF = (dx * F_x) \oplus (dy * (F_y \oplus (dx * F_{xy}))).$$

19. A method of processing a Boolean function comprised of a plurality of Boolean subfunctions of corresponding variables in a memory and processing circuit, said plurality of Boolean subfunctions being related to each other in a hierarchic order, at least one of said Boolean subfunctions being a function of at least two independent variables, said plurality of Boolean subfunctions being related to each other in a hierarchic order having a plurality of levels, each of said Boolean subfunctions being a function of two variables, a lowest level of said hierarchic order of Boolean functions having independent variables, each higher level of said hierarchic order of Boolean functions having as its corresponding variables two of the next lower order Boolean subfunctions until said complex Boolean is obtained, comprising the steps of:

initializing said memory and processing circuit by:

generating in said processing circuit an initial value signal, F(0), corresponding to an initialized value of said Boolean function when all independent variables are set to 0;

generating in said processing circuit a partial differential signal for each said subfunction of said Boolean function at each level; and storing in said memory said initial value signal, F(0), corresponding to said initialized value of said Boolean function and partial derivatives corresponding to each said level, and generating a plurality of total differential signals in said processing circuit corresponding to a total derivative of each subfunction at each said level, by:

generating one of said plurality of total differential signals for each said subfunctions at each node at said level according to a predetermined method of operating said processing circuit, each subfunction being related to other ones of said subfunctions at a next lower level in said hierarchic order and to said Boolean function according to a sequence of related levels in a logic tree; and generating in said processing circuit said Boolean function from said logic tree by steps modeled by the equation $$F(\vec{v}) = F(\vec{0}) + dF(\vec{v})$$

where F is the Boolean function, $\vec{v}$ a vector having said plurality of independent variables as elements, and dF the total derivative of said Boolean function at the highest level of said logic tree.

20. The method of claim 19 where said predetermined method of operating said processing circuit to generate said total differential signal for each said subfunctions operates said processing circuit so that operation of said processing circuit is modeled by the equation $$dF = F_x dx \oplus F_y dy \oplus F_{xy} dxdy.$$

21. The method of claim 19 where said predetermined method of operating said processing circuit to generate a total differential signal for each said subfunctions operates said processing circuit so that operation of said processing circuit is modeled by the equation $$dF = \overline{dx} dy F_y + dx \overline{dy} F_x + dxdy(F_x \oplus F_y \oplus F_{xy}).$$

22. The method of claim 19 where said predetermined method of operating said processing circuit to generate said total differential signal for each said subfunctions operates said processing circuit so that operation of said processing circuit is modeled by the equation $$dF = \overline{dx + \overline{dy} + \overline{F_y}} + \overline{\overline{dx} + dy + \overline{F_x}} + \overline{\overline{dx} + \overline{dy} +} \\ \overline{F_x \oplus F_y \oplus F_{xy}}.$$

23. The method of claim 19 where said predetermined method of operating said processing circuit to generate said total differential signal for each said subfunctions operates said processing circuit so that operation of said processing circuit is molded by the equation $$dF = (dx * F_x) \oplus (dy * (F_y \oplus (dx * F_{xy}))).$$

24. The method of claim 19 where said step of generating in said processing circuit an initial value signal is repeated for each new set of independent variables for which said Boolean function is evaluated.

25. The method of claim 19 where said step of generating said total differential signal for each of said subfunctions according to a predetermined method of operating said processing circuit comprises the step operating a plurality of separate processing subcircuits, said plurality of subcircuits coupled to each other to form a tree circuit.

26. The method of claim 19 where said step of generating said total differential signal for each said subfunctions according to a predetermined method of operating said processing circuit comprises the step operating a central processing circuit and a memory where a plurality of arrays are defined in said memory for storing independent variable inputs, for storing total differential signals for each of said subfunctions, and for storing partial differential signals for each of said subfunctions, said plurality of being stored in said memory according to a tree structured logic, said central processing circuit operating upon said arrays to relate elements of said arrays using said predetermined method for relating each element in that one of said arrays for storing total differential signals to other elements in said one array.

* * * * *